US011442338B2

(12) United States Patent
Itsuji

(10) Patent No.: US 11,442,338 B2
(45) Date of Patent: Sep. 13, 2022

(54) ILLUMINATION APPARATUS AND CAMERA SYSTEM

(71) Applicant: CANON KABUSHIKI KAISHA, Tokyo (JP)

(72) Inventor: Takeaki Itsuji, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 178 days.

(21) Appl. No.: 17/069,916

(22) Filed: Oct. 14, 2020

(65) Prior Publication Data
US 2021/0116788 A1 Apr. 22, 2021

(30) Foreign Application Priority Data

Oct. 17, 2019 (JP) .............................. JP2019-190193

(51) Int. Cl.
F21V 3/00 (2015.01)
F21V 29/67 (2015.01)
F21V 29/15 (2015.01)
F21V 29/58 (2015.01)
F21V 29/56 (2015.01)
F21V 29/50 (2015.01)
G03B 15/03 (2021.01)
(Continued)

(52) U.S. Cl.
CPC .............. G03B 15/03 (2013.01); F21V 3/00 (2013.01); F21V 29/15 (2015.01); F21V 29/50 (2015.01); F21V 29/56 (2015.01); F21V 29/59 (2015.01); F21V 29/673 (2015.01); H03B 17/00 (2013.01); H04N 5/2256 (2013.01); G03B 2215/0567 (2013.01); H03B 2200/0084 (2013.01)

(58) Field of Classification Search
CPC ............ H01S 5/02407; H01S 5/02423; H01S 3/0404; F21V 19/003; F21V 3/00; F21V 29/67; F21V 29/15; F21V 29/58; F21V 29/56; F21V 29/50; F21Y 2115/10; G02B 21/084
See application file for complete search history.

(56) References Cited

U.S. PATENT DOCUMENTS 6,448,553 B1 9/2002 Itsuji et al.
6,835,925 B2 12/2004 Itsuji et al.
(Continued)

FOREIGN PATENT DOCUMENTS

JP 2013-206693 A 10/2013
JP 2014-200065 A 10/2014
JP 2018-087725 A 6/2018

Primary Examiner — William J Carter
(74) Attorney, Agent, or Firm — Venable LLP

(57) ABSTRACT

An illumination apparatus includes a case, a plurality of oscillators configured to generate electromagnetic waves, and housed in the case and arranged two-dimensionally, a window unit configured to emit therefrom the electromagnetic waves, and disposed on a first side of the case, a plurality of inflow holes configured to allow fluid to flow into the case, and disposed at positions at which the electromagnetic waves from the window unit propagate, and a discharging unit configured to discharge the fluid, which has flowed into the case, out of the case, and disposed on a second side of the case, which is an opposite side to the first side. When the oscillator is viewed from the window unit, a part of the oscillator is located on an inner side of the inflow hole, and the fluid which has flowed into the case through the inflow hole reaches the oscillator.

14 Claims, 13 Drawing Sheets

(51) Int. Cl.
*H04N 5/225* (2006.01)
*H03B 17/00* (2006.01)

(56) References Cited

U.S. PATENT DOCUMENTS

| | | | |
|---|---|---|---|
| 7,248,995 B2 | 7/2007 | Itsuji et al. | |
| 7,358,918 B2 | 4/2008 | Itsuji | |
| 7,542,000 B2 | 6/2009 | Itsuji | |
| 7,560,695 B2 | 7/2009 | Kasai et al. | |
| 7,570,216 B2 | 8/2009 | Itsuji | |
| 7,633,299 B2 | 12/2009 | Itsuji | |
| 7,745,791 B2 | 6/2010 | Kasai et al. | |
| 7,884,767 B2 | 2/2011 | Itsuji | |
| 7,919,752 B2 | 4/2011 | Itsuji | |
| 7,922,659 B2 | 4/2011 | Itsuji et al. | |
| 8,003,961 B2 | 8/2011 | Itsuji | |
| 8,067,739 B2 | 11/2011 | Itsuji | |
| 8,129,683 B2 | 3/2012 | Itsuji et al. | |
| 8,207,501 B2 | 6/2012 | Katagiri et al. | |
| 8,344,324 B2 | 1/2013 | Kasai et al. | |
| 8,451,069 B2 | 5/2013 | Sekiguchi et al. | |
| 8,618,486 B2 | 12/2013 | Itsuji | |
| 10,326,255 B2 * | 6/2019 | Honda | H01S 5/02423 |
| 2003/0132210 A1 * | 7/2003 | Fujii | B23K 26/14 |
| | | | 219/121.84 |
| 2005/0135452 A1 * | 6/2005 | Ishizu | H01S 3/042 |
| | | | 372/69 |
| 2012/0069584 A1 * | 3/2012 | Kawabe | H05K 1/189 |
| | | | 174/254 |
| 2014/0183363 A1 | 7/2014 | Kajiki et al. | |
| 2014/0266477 A1 | 9/2014 | Sekiguchi et al. | |
| 2016/0365701 A1 * | 12/2016 | Takigawa | H01S 5/0222 |
| 2019/0259791 A1 | 8/2019 | Itsuji et al. | |
| 2020/0293806 A1 | 9/2020 | Sato et al. | |
| 2020/0296265 A1 | 9/2020 | Itsuji et al. | |
| 2020/0296266 A1 | 9/2020 | Koyama et al. | |

* cited by examiner

TOP VIEW

A-A' CROSS-SECTIONAL VIEW

ILLUMINATION APPARATUS AND CAMERA SYSTEM

BACKGROUND OF THE INVENTION

Field of the Invention

The present invention relates to an illumination apparatus using an electromagnetic wave, and a camera system.

Description of the Related Art

Compared with visible light or infrared light, a terahertz wave, which is an electromagnetic wave with a frequency ranging from at least 0.2 THz to not more than 30 THz, has a longer wavelength, and therefore is less influenced by scattering, and also has high transmissivity relative to many substances. Furthermore, compared with a millimeter wave, the terahertz wave has a shorter wavelength, therefore it is expected that a camera which provides higher resolution is implemented by using the terahertz wave. In the abovementioned frequency band, i.e., from at least 0.2 THz to not more than 30 THz, many characteristic absorption patterns, depending on the structure and state of various substances, e.g., biomolecules or resin, are observed. Hence utilizing this characteristic of the terahertz waves, applying in place of X-rays the terahertz wave to an imaging technique is expected. For example, the application of terahertz waves to frisking and monitoring security techniques in public spaces is expected.

Cameras of type that detects a millimeter wave and a terahertz wave include: a passive-type which selectively detects desired electromagnetic waves out of electromagnetic waves (radio waves and lights) which are generated from a subject by thermal radiation; and an active-type which emits a desired electromagnetic wave to a subject, and detects an electromagnetic wave reflected by the subject. Since the electromagnetic waves generated from a subject by thermal radiation are weak, a commonly used passive-type camera has to select an electromagnetic wave that is detected using a high frequency circuit, e.g., a mixer, and reduce the noise of the high frequency circuit. In particular, a passive-type camera, which detects the temperature difference between the subject and the environment of the subject, is desired to detect the most minute temperature difference. Therefore, an improvement in the signal-to-noise ratio (SNR) is demanded for a passive-type camera. An active-type camera, on the other hand, detects the intensity ratio between an electromagnetic wave emitted to a subject and an electromagnetic wave reflected by the subject to advance back to the camera, hence the active-type camera receives less influence of the environmental temperature than a passive-type camera. In other words, compared with a passive-type camera, an active-type camera is an imaging apparatus of which flexibility in installation is higher and the application range is wider.

In the case where the subject is a human body, the wavelength of the terahertz wave is similar to or longer than the size of irregularities on the surface of the skin, hence the skin of the subject is regarded as a mirror surface with respect to the terahertz wave. This means that an active-type camera is a camera which performs regularly reflected imaging by detecting and visualizing an electromagnetic wave which regularly reflects from the object. For such a camera that performs the regular reflection imaging, a technique is proposed that provides a surface-type illumination apparatus, on which a plurality of elements which generate a terahertz wave are integrated and arranged on an arrangement surface, in order to improve the SNR of the image by increasing a number of bright spots in an acquired image (Japanese Patent Application Publication No. 2018-87725).

In order to improve the SNR of an image, it is effective to increase the output of the generation source of the terahertz wave, so as to increase the brightness of the bright spots of an acquired image. However, in the frequency band of a terahertz wave, a technique to provide a generation source which stably operates at room temperature has not yet been established, unlike the case of solid-state devices used in a visible light region or infrared light region. Therefore, a technique to generate a terahertz wave using a resonant circuit, which is used for millimeter wave devices, is used. For example, oscillation elements each created by integrating an antenna, which serves as an external resonant circuit, with an element, which has a gain in the frequency band of the terahertz wave (e.g. transistor, diode), are arrayed to form a terahertz oscillator (Japanese Patent Application Publication No. 2014-200065).

In the case of packaging the abovementioned oscillators at high density, a device cooling technique is demanded to operate the device more stably. For this, in a technique to integrate linear light-emitting diodes (LEDs), a cooling technique to allow fluid to contact with each LED by using a nozzle disposed outside the LED light distribution angle was proposed to compensate for the limitation of the cooling efficiency by using a radiation fin (Japanese Patent Application Publication No. 2013-206693).

As mentioned above, in order to improve the SNR of an image, the active-type camera, which performs the regular reflection imaging, uses a surface-type illumination apparatus in which a plurality of oscillators are integrated and arranged on the arrangement surface, while increasing the output of the terahertz waves from each oscillator by arraying the oscillation elements. In this case, however, each oscillator of the terahertz wave is a heat source, which means that the heat generation volume of the illumination apparatus of the camera increases as the power consumed by each oscillator increases, and the degree of integration of the oscillators increases.

When the abovementioned technique is applied to a surface-type illumination apparatus and fluid is supplied from the side of each oscillator disposed on the surface, in-plane distribution is generated in the flow speed and temperature of the fluid. As a result, the cooling efficiency of the oscillators disperses.

With the foregoing in view, it is an object of the invention to provide a technique to reduce the dispersion of cooling efficiency of the oscillators in the illumination apparatus.

SUMMARY OF THE INVENTION

According to the disclosure herein, it is provided an illumination apparatus, including a case, a plurality of oscillators configured to generate electromagnetic waves, and housed in the case and arranged two-dimensionally, a window unit configured to emit therefrom the electromagnetic waves, and disposed on a first side of the case, a plurality of inflow holes configured to allow fluid to flow into the case, and disposed at positions at which the electromagnetic waves from the window unit propagate, and a discharging unit configured to discharge the fluid, which has flowed into the case, out of the case, and disposed on a second side of the case, which is an opposite side to the first side, wherein when the oscillator is viewed from the window unit, at least a part of the oscillator is located on an inner side of the inflow hole, and the fluid which has flowed into the case through the inflow hole reaches the oscillator.

In addition, according to the disclosure herein, it is provided a camera system, acquiring a two-dimensional distribution of electromagnetic waves from a subject, the camera system including the above illumination apparatus configured to irradiate the subject with the electromagnetic waves, an image forming unit configured to form an image of the electromagnetic waves reflected by the subject, and a sensor unit configured to detect a two-dimensional distribution of the electromagnetic waves formed by the image forming unit.

Further features of the present invention will become apparent from the following description of exemplary embodiments with reference to the attached drawings.

DESCRIPTION OF THE EMBODIMENTS

Embodiments of the technique of the present invention will be described with reference to the drawings. Dimensions, materials, shapes and relative positions of the components described below should be appropriately changed depending on the configuration and various conditions of an apparatus to which the invention is applied, and therefore are not intended to limit the scope of the invention. A well-known art or commonly used art of this technical field may be applied to configurations or steps which are not specifically illustrated or described. Redundant description may be omitted.

Figure 13:
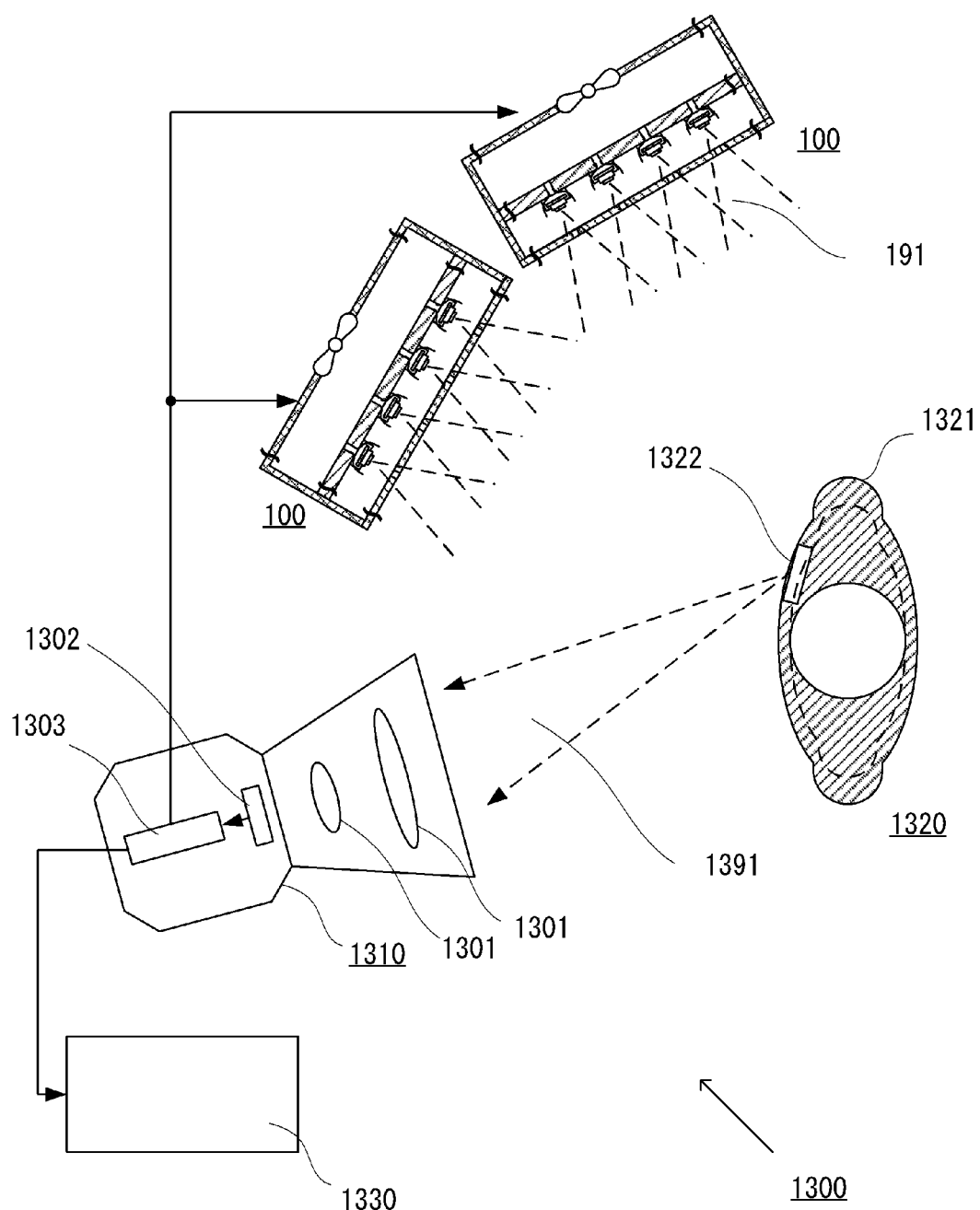
FIG. 13 is a diagram illustrating a configuration example of a camera system according to a technique of the present invention.

A terahertz wave camera, which is an example of an imaging apparatus according to a technique of the present invention, is an active-type terahertz wave camera including a surface-type illumination apparatus in which oscillators, to generate a terahertz wave (an example of an electromagnetic wave), are two-dimensionally arranged. FIG. 13 is an example of a configuration of a terahertz wave camera system which uses the terahertz wave camera according to a technique of the present invention. A terahertz wave camera system 1300 is a system that acquires a two-dimensional distribution of terahertz waves 1391 which reach from a subject 1320 to a terahertz wave camera 1310.

The terahertz wave camera system 1300 includes an illumination apparatus 100 and the terahertz wave camera 1310. The illumination apparatus 100 is a surface-type illumination apparatus that emits terahertz waves 191 to the subject 1320. The frequency of the terahertz waves 191 is at least 0.2 THz and not more than 30 THz. The terahertz wave camera 1310 is an imaging apparatus that receives terahertz waves 1391 reflected from the subject 1320, and acquires two-dimensional distribution of the terahertz waves. An example of a specific configuration of the terahertz wave camera 1310 is disclosed in Japanese Patent Application Publication No. 2018-87725. The terahertz wave camera 1310 includes an image forming unit 1301 which forms an image of the terahertz waves 1391 reflected from the subject 1320. The image forming unit 1301 is constituted of a lens group and a mirror group. An image of the two-dimensional distribution of the terahertz waves 1391 formed by the image forming unit 1301 is detected by a sensor unit 1302.

The sensor unit 1302 is a sensor in which elements to detect the terahertz waves are two-dimensionally arranged. A rectifier-type detection element can be used for the element to detect the terahertz waves. Examples of the rectifier-type detection element are a Schottky barrier diode (SBD), a self-switching diode, and a metal-insulator-metal (MIM) diode. For the element to detect the terahertz waves, such transistors as a field effect transistor (FET) and a high electron mobility transistor (HEMT), or a detection element using a quantum well, can be used. The sensor unit 1302 may include a circuit to read signals of elements corresponding to each pixel, which is used for a CMOS image sensor.

Signals detected by the sensor unit 1302 are sent to a processing unit 1303, and are converted into image data by the processing unit 1303. The processing unit 1303 also controls the emission timing of the terahertz wave 191 generated by the illumination apparatus 100. By controlling the emission timing of the terahertz wave 191, the processing unit 1303 can improve the SNR of the image data and remove fixed patterns, using a known signal processing technique such as correlation double sampling. The image data converted by the processing unit 1303 is sent to an external image processing apparatus 1330, for example, and is used for visualization processing and processing to determine the state of the subject 1320, performed by the image processing apparatus 1330.

In the case of monitoring a concealed object 1322 carried by the subject 1320, it is preferable that the emitted-terahertz waves are able transmit through the clothe 1321 that the subject 1320 is wearing. Therefore, considering the transmissivity of the terahertz waves with respect to the clothe 1321, the frequency of the terahertz waves used for the technique of the present invention is preferably not more than 1 THz. Further, in order to sufficiently ensure the capability to identify the concealed object 1322, it is preferable that a number of pixels in the sensor unit 1302 is more than 10,000 pixels. Since the wavelength of a terahertz wave is several hundred μm, the pixel size of the sensor unit 1302 is determined based on this wavelength. Therefore, the size of the sensor unit 1302 is typically several ten mm. Based on this size of the sensor unit 1302, the sizes of the optical system and the mechanical parts of the terahertz wave camera 1310 are determined. According to research of the present inventors, the frequency band of the terahertz waves is preferably 0.4 THz to 0.6 THz, in order to implement both sufficient transmissivity to the clothes 1321 and the capability to identify the concealed object 1322, while maintaining a size of the camera that is portable for the user. However, the frequency band of the terahertz waves is not limited to this, but may be appropriately selected in accordance with the application target of the terahertz wave camera.

For the surface-type illumination apparatus 100, an oscillator, where each oscillation element in which an element (e.g. transistor, diode) having a gain in the frequency band of the terahertz wave is integrated with an antenna structure (external resonant circuit) is arrayed, is used. For example, a resonant tunneling diode (RTD) is used as the element having the gain. An example of a detailed configuration of this oscillator is disclosed in Japanese Patent Application Publication No. 2014-200065.

Figure 1:
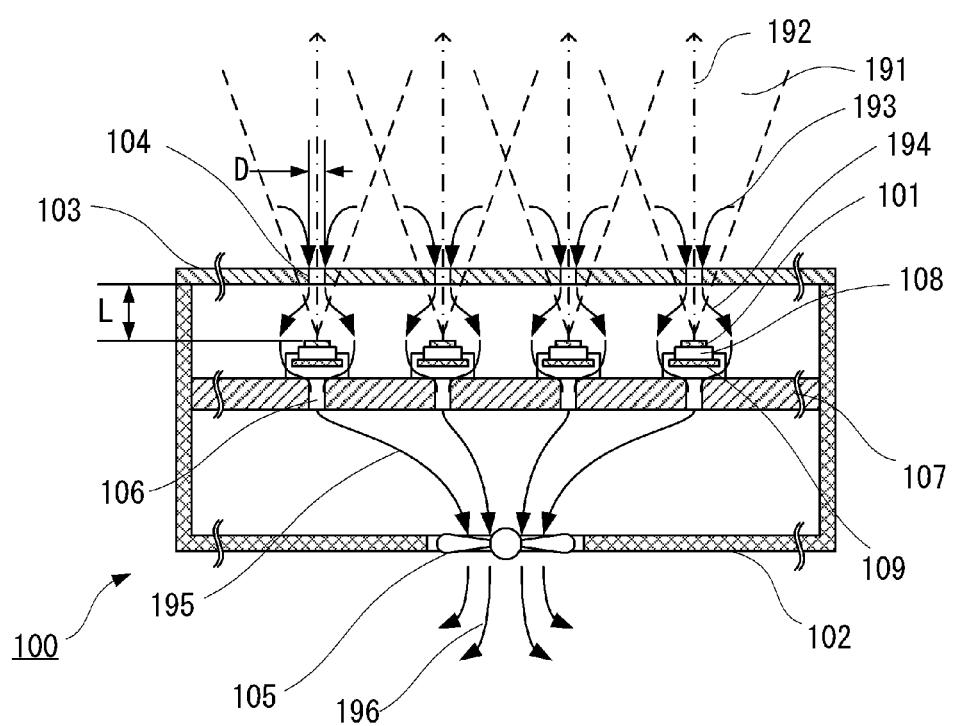
FIG. 1 is a cross-sectional view illustrating a configuration example of an illumination apparatus according to Embodiment 1.
Figure 2:
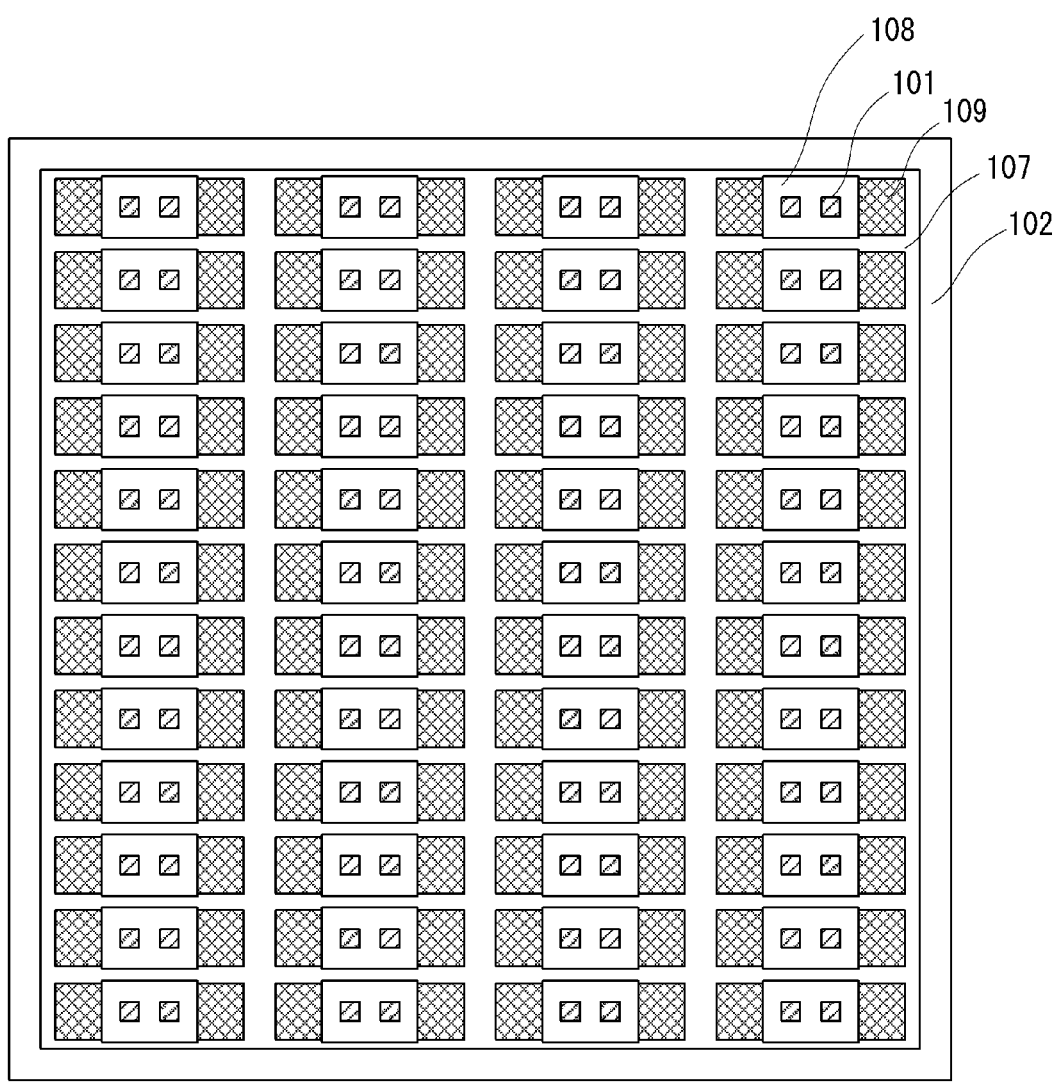
FIG. 2 is a diagram illustrating an illumination apparatus and an arrangement example of oscillators according to Embodiment 1.

FIG. 1 is a cross-sectional view illustrating a configuration example of the illumination apparatus 100. FIG. 2 is a diagram illustrating an arrangement example of the oscillators 101 used for the illumination apparatus 100. In the surface-type illumination apparatus 100, a plurality of oscillators 101 are two-dimensionally arranged. For example, as illustrated in FIG. 2, a plurality of oscillators 101 are arranged in a matrix on an arrangement surface. According to the technique of the present invention, as illustrated in FIG. 1, fluid 193 (preferably air) outside a case 102 of the illumination apparatus 100 is drawn into the case 102 in the emitting direction of the terahertz waves 191 generated by the oscillators 101. Then the oscillators 101 are cooled by the fluid 193. The flow speed of the fluid 193 is adjusted by a plurality of inflow holes 104, which allow the fluid 193 outside the case of the illumination apparatus 100 to flow into the case. Each inflow hole 104 is disposed near each oscillator 101 on the side of the case 102 where the terahertz waves 191 are emitted. In each set of an inflow hole 104 and an oscillator 101, which is cooled by the fluid 194 flowing in from the inflow hole 104, the distance from the inflow hole 104 to the oscillator 101 is approximately the same, which means that the flow rate and the flow speed of the fluid of the fluid 194 which reach each oscillator 101 are also approximately the same. Therefore, a decrease in the dispersion of the cooling efficiency among each oscillator 101 of the illumination apparatus 100 can be expected.

Embodiments of the technique of the present invention will be described. Embodiments, however, are not limited to the configurations described below, but can be modified and changed in various ways within a scope of the intention of the present invention, that is, to implement a configuration that solves the problems of prior art by using the present invention.

Embodiment 1

An illumination apparatus according to Embodiment 1 will be described. Description on a portion that is the same as the above description will be omitted.

The illumination apparatus according to Embodiment 1 has a configuration of the illumination apparatus 100 illustrated in FIG. 1. The illumination apparatus 100 includes oscillators 101, a case 102, a window unit 103, inflow holes 104, and a discharging unit 105. The illumination apparatus 100 includes a plurality of oscillators 101 which are two-dimensionally arranged. Each oscillator 101 generates a terahertz wave 191. The oscillator 101 may generate a radio wave (e.g. a millimeter wave) or light instead of the terahertz wave 191. The plurality of oscillators 101 are housed inside the case 102 of the illumination apparatus 100.

The window unit 103 is disposed on the case 102 on the side where the terahertz wave 191 is emitted, and creates a closed space with the case 102. The side of the case 102 where the terahertz wave 191 is emitted is an example of the "first side". It is preferable that the terahertz wave 191 can transmit through the window unit 103. The materials used for the window unit 103 are such resin-based materials as polystyrene, polyethylene, Teflon (registered trademark) and polyolefin. By using a material through which the terahertz wave 191 can transmit, a loss of the terahertz wave 191 caused by the window unit 103 can be reduced.

A plurality of inflow holes 104 are formed in the window unit 103. Each inflow hole 104 is disposed at a position where a terahertz wave 191, generated by each oscillator 101, propagates. Specifically, the inflow hole 104 is disposed at a position where a travelling axis 192 of the terahertz wave 191 and the window unit 103 approximately meet. The fluid 193 flows into the case 102 through each inflow hole 104. In the following description, the fluid 193 that flows into the case 102 is also referred to as the "first fluid 194".

The inflow hole 104 is an opening formed in the window unit 103. The shape of the inflow hole 104 in FIG. 1 is circular when viewed from the top of the window unit 103. However, the shape of the inflow hole 104 is not limited to a circle, but may be a polygon, a shape formed by combining a plurality of curves, a shape formed by combining a polygon and a curved shape, or the like. In Embodiment 1, a minimum width of the inflow hole 104 is assumed to be D, as illustrated in FIG. 1. In the case where the inflow hole 104 is a circle, the minimum width D is the diameter of the circle. In the case where the shape of the inflow hole 104 is a shape of combining a polygon and a curved shape, the minimum width D is a minimum distance in a direction parallel with the top surface of the window unit 103 where the inflow holes 104 are formed. Each inflow hole 104 in FIG. 1 is formed to extend in a direction vertical to the top surface of the window unit 103, but may be formed to extend in a direction diagonal with respect to the top surface of the window unit 103.

Figure 12A:
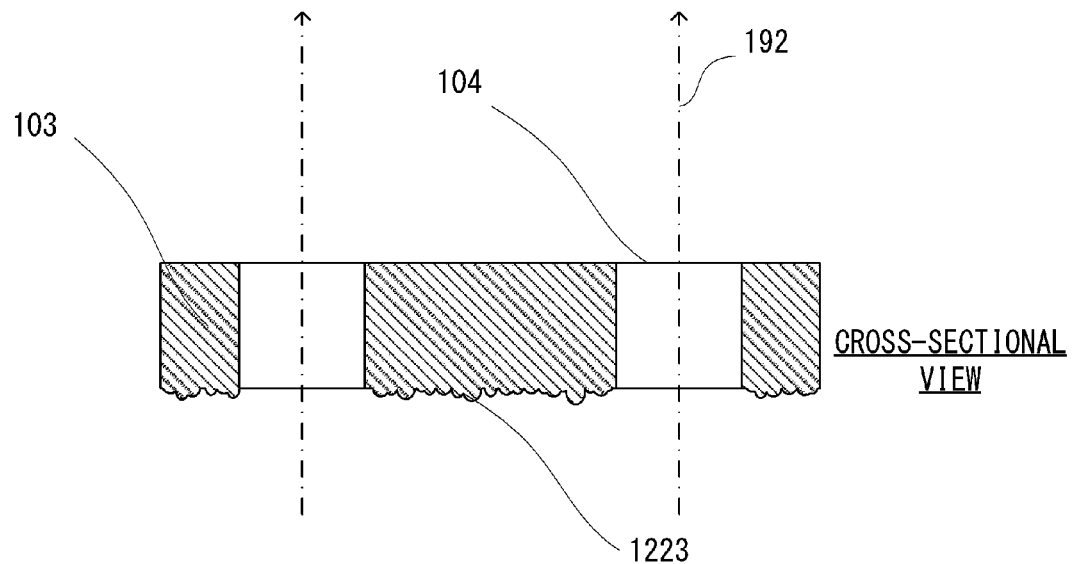
FIG. 12A and FIG. 12B are diagrams illustrating an example of a surface shape of a window unit of an illumination apparatus according to Embodiment 1.
Figure 12B:
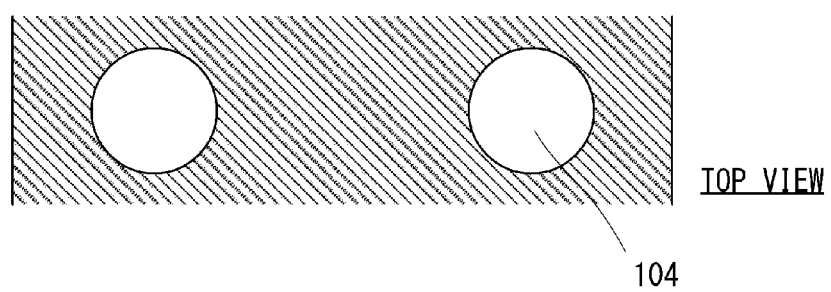

The surface of the window unit 103 may have an irregular structure 1223, as illustrated in FIG. 12A and FIG. 12B. In FIG. 12A and FIG. 12B, the irregular structure 1223 is formed on the bottom surface of the window unit 103, but may be formed on the top surface of the window unit 103. The irregular structure 1223 is formed by processing the top surface or the bottom surface of the window unit 103, so that irregularity is repeated at intervals smaller than the wavelength of the terahertz wave 191. By this structure, the change of reflectance in the window unit 103 with respect to the terahertz wave 191 is smoothed, and the loss of the terahertz wave 191 caused by the window unit 103 can be reduced.

Moreover, the discharging unit 105 is disposed on the side of the case 102 that is the opposite side of the window unit 103 to which the terahertz wave 191 is emitted. The side of the case 102 that is the opposite of the side where the terahertz wave 191 is emitted is an example of the "second side" of the case 102. The discharging unit 105 includes a fan, and the inside of the case 102 is set to negative pressure by driving the fan, whereby the flow of air outside the case 102 into the case 102 is promoted, and the fluid that flowed into the case 102 is discharged out of the case 102 via the discharging unit 105. The configuration to discharge the fluid out of the case 102 via the discharging unit 105 may be implemented using a vacuum pump instead of the fan. In the following description, the fluid that flows around a package 108 and flows through an outflow hole 106 is also referred to as the "fluid 195 inside the case". Further, the fluid that is discharged out of the case 102 through the discharging unit 105 is also referred to as the "second fluid 196".

In the case of the example illustrated in FIG. 1, the terahertz waves 191 generated by a plurality of oscillators 101 are emitted in directions approximately vertical to the surface where the plurality of oscillators 101 are arranged. By forming the inflow holes 104 at positions overlapping with the travelling axes 192 of the terahertz waves 191, the inflow holes 104 are arranged so as to face the oscillators 101. Here, as illustrated in FIG. 1, the distance from the inflow hole 104 to the oscillator 101 is assumed to be L. The distance L from the inflow hole 104 to the oscillator 101 may also be referred to as the "distance L between the oscillator 101 and the inflow hole 104".

By the discharging unit 105, the fluid 195 inside the case is discharged out of the case 102 as the second fluid 196, and the fluid 193 outside the case flows into the case 102 through the inflow holes 104 as the first fluid 194. The inflow holes 104 and the oscillators 101 are configured such that the first fluid 194 which flows into the case 102 through each inflow hole 104 reaches the oscillator 101 facing this inflow hole 104. If each distance L from the oscillator 101 to the inflow hole 104 is approximately the same, and the flow speed of the first fluid 194 guided to each oscillator 101 also becomes approximately the same. Thereby dispersion of the cooling efficiency among a plurality of oscillators 101 can be suppressed.

A plurality of the outflow holes 106 are formed on a part of a substrate 107. As illustrated in FIG. 1, the outflow holes 106 are disposed at positions facing the oscillators 101 and the inflow holes 104 respectively. It is preferable that the outflow holes 106 are disposed at positions overlapping with the packages 108 respectively when viewed from the top of the window unit 103. Thereby each oscillator 101 and each outflow hole 106 are disposed facing each other via the package 108. The first fluid 194 flows around the oscillators 101 and the package 108 and flows into the outflow holes 106. Then the first fluid 194 flows through the outflow holes 106, and moves inside the case 102 as the fluid 195 inside the case. According to this configuration, the paths of the first fluid 194 are formed around the oscillators 101, the packages 108 and heat radiation units 109 by the inflow holes 104 and the outflow holes 106, and the flow speed of the first fluid 194 increases. As a result, an improvement of the cooling efficiency for the oscillators 101 can be expected.

As illustrated in FIG. 1, each oscillator 101 is mounted on the package 108. Further, the heat radiation unit 109, to radiate heat generated from the package 108, is disposed so as to contact with the bottom surface of the package 108. The heat radiation unit 109 is a member to release heat generated from the package 108 to the outside, and is formed of a material of which thermal conductivity is high (e.g. metal). It is preferable that an irregular structure, to increase the surface area of the member, such as a heat sink, is formed in the heat radiation unit 109. In order to decrease the thermal resistance of the package 108, which exists between the oscillator 101 and the heat radiation unit 109, a ground wire from the oscillator 101 is connected to the heat radiation unit 109. The package 108 is fixed to the substrate 107 inside the case 102. A part of the heat generated from the oscillator 101 is transferred to the substrate 107 via the package 108. Therefore, it is preferable that the substrate 107 is disposed so as to contact with the case 102. Thereby a part of the heat transferred from the package 108 to the substrate 107 can be released to the case 102.

FIG. 2 is a top view of the illumination apparatus 100 illustrated in FIG. 1. Specifically, FIG. 2 is a top view of the illumination apparatus 100 excluding the window unit 103. In Embodiment 1, the packages 108 are arranged in a matrix on the substrate 107 inside the case 102. The arrangement of the packages 108 is not limited to this, but may be a linear arrangement. Moreover, the arrangement shape of the packages 108 may be another geometric shape. In Embodiment 1, two oscillators 101 are mounted in each package 108. However, a number of oscillators 101 mounted on the package 108 is not limited to two. For example, one oscillator 101 may be mounted on one package 108. The heat radiation unit 109 disposed for each package 108 is a plate-type member, and in the top view of the illumination apparatus 100, the size of the heat radiation unit 109 is larger than the package 108. By making the size of the heat radiation unit 109 larger than the package 108 like this, the heat radiation area can be increased and the cooling efficiency can be improved. The structure of the heat radiation unit 109 is not limited to a plate-type structure, but may be an irregular structure or a fin structure in order to increase the surface area of the member. Thereby dispersion of the cooling efficiency among the plurality of oscillators 101 can be suppressed. Furthermore, the oscillators 101 can be arranged at a higher density, since the operation of the oscillators 101 can be stabilized even more.

Figure 3:
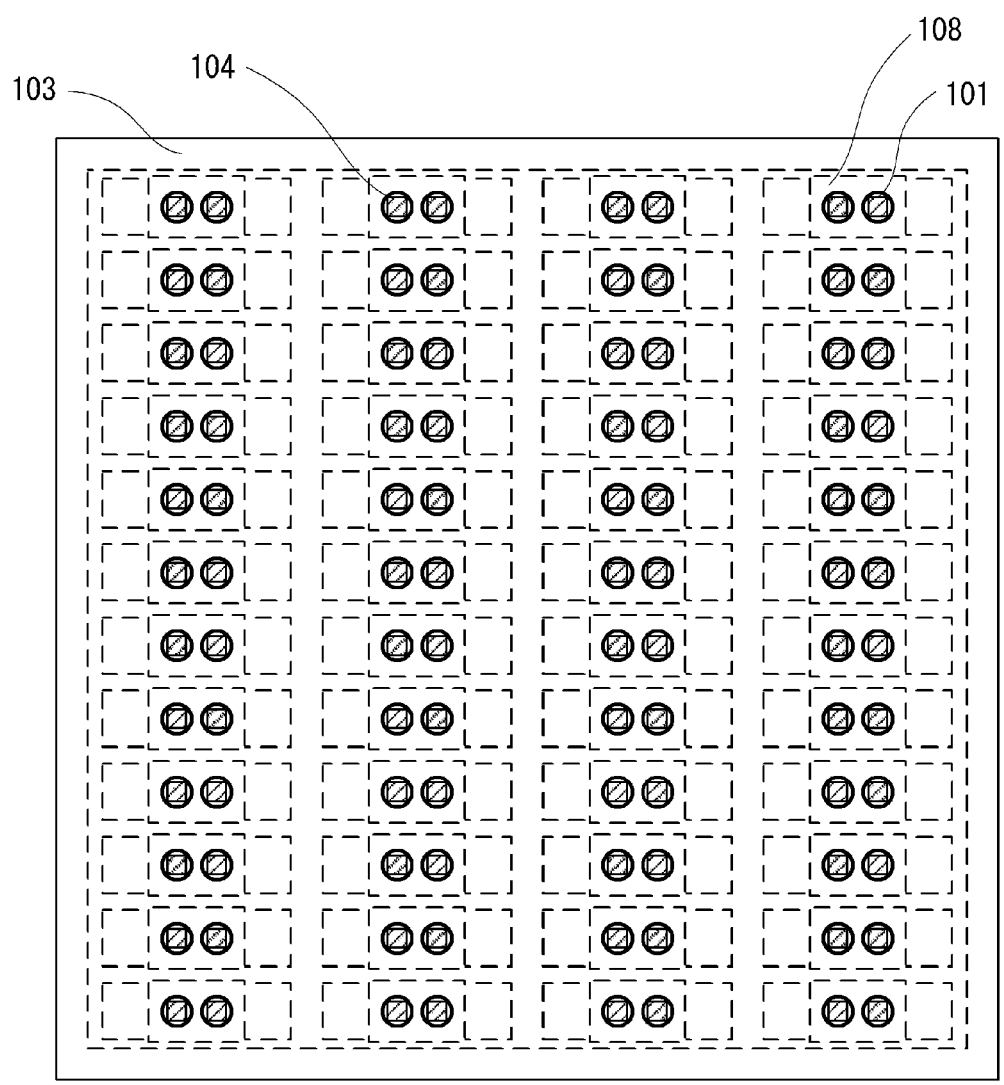
FIG. 3 is a diagram illustrating an arrangement example of oscillators and inflow holes according to Embodiment 1.

FIG. 3 is a top view of the illumination apparatus 100 illustrated in FIG. 1 and FIG. 2. FIG. 3 includes the window unit 103 as well. More specifically, FIG. 3 indicates an example of the arrangement of the oscillators 101 and the inflow holes 104. As illustrated in FIG. 3, in the top view of the window unit 103, each oscillator 101 is disposed at a position that approximately overlaps with the center of each inflow hole 104 formed in the window unit 103. Thereby at least a part of each oscillator 101 is located on the inner side of the inflow hole 104 when the oscillator 101 is viewed from the window unit 103 side. The oscillators 101 and the inflow holes 104 are arranged to correspond to each other one-to-one. Further, in the top view of the window unit 103, the travelling axis 192 of the terahertz wave 191 generated by each oscillator 101 approximately matches with the center of the inflow hole 104. Furthermore, the oscillators 101 and the inflow holes 104 are arranged to correspond to each other one-to-one, hence the distance L between each oscillator 101 and the corresponding inflow hole 104 becomes approximately the same for all combinations of oscillators and inflow holes. Thereby the dispersion of the flow speed of the first fluid 194 that reaches each oscillator 101 is suppressed, and the dispersion of the cooling efficiency of each oscillator 101 is also suppressed. Moreover, in the top view of the window unit 103, each oscillator 101 is disposed approximately at the center of the inflow hole 104, hence the terahertz wave 191 propagates through approximately the center of each inflow hole 104. As a consequence, the region where the propagation range of the terahertz wave 191 and the window unit 103 overlap becomes smaller by the area size of the region where each inflow hole 104 is formed, therefore the loss of the terahertz wave 191 caused by the window unit 103 also decreases.

Figure 4:
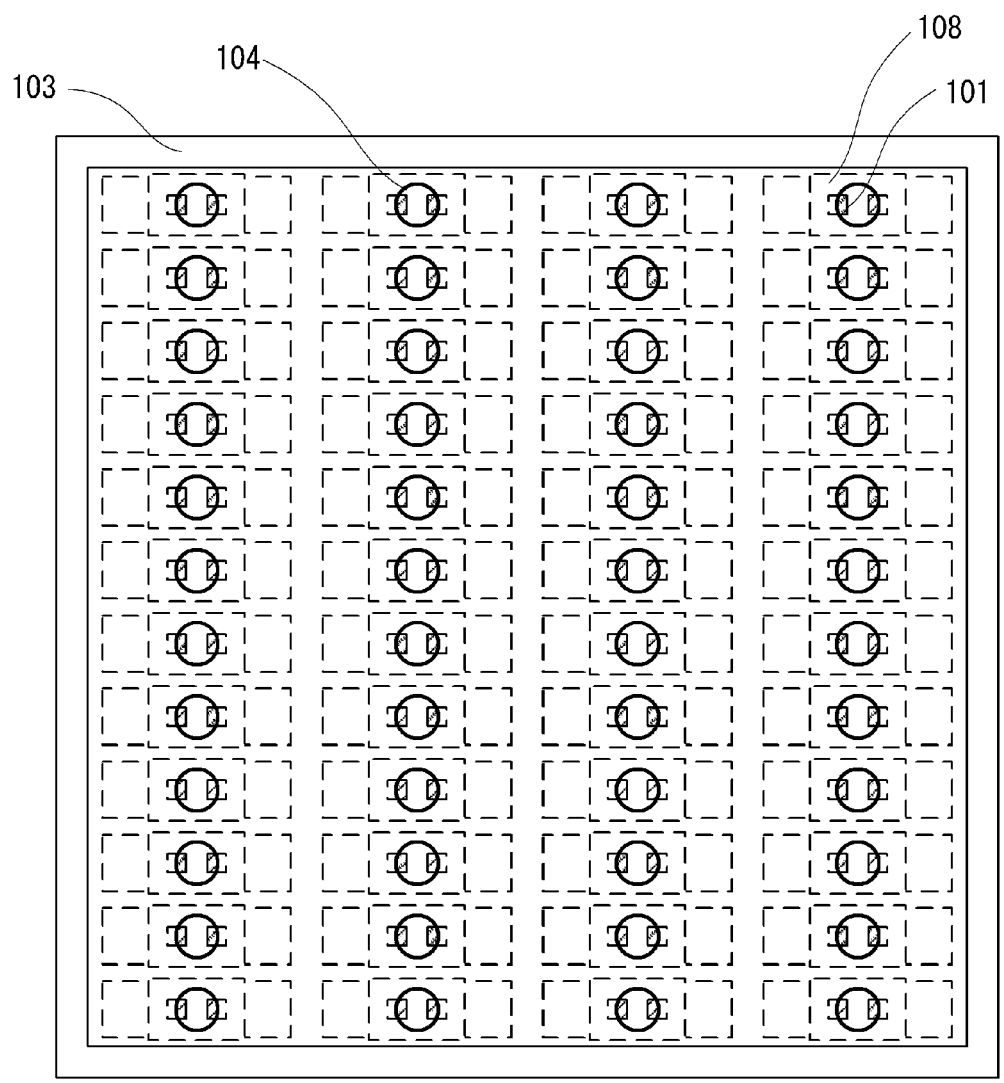
FIG. 4 is a diagram illustrating another arrangement example of oscillators and inflow holes according to Embodiment 1.

FIG. 4 is a top view of the illumination apparatus 100, illustrating another arrangement example of the oscillators 101 and the inflow holes 104. More specifically, the oscillators 101 and the inflow holes 104 are arranged to correspond to each other N-to-1 (N is a natural number). In the case of the example illustrated in FIG. 4, N is 2 and the oscillators 101 and the inflow holes 104 are arranged to correspond to each other 2-to-1. Further, in the top view of the window unit 103, a part of each oscillator 101 overlaps with a region where an inflow hole 104 is formed. Furthermore, in the top view of the window unit 103, approximately half of the region occupied by each oscillator 101 overlaps with a region where an inflow hole 104 is formed. Here FIG. 4 indicates a case where N is 2, but N may be a different natural number.

The flow speed of the first fluid 194 that reaches each oscillator 101 is in inverse proportion to the ratio of the surface area of the inflow hole 104 to the surface area of the window unit 103 (also referred to as the "opening ratio"). In theory the flow rate of the first fluid 194 does not change unless the opening ratio changes. However, if the inflow hole 104 becomes smaller, the flow speed of the first fluid 194 decreases, and as a result, the flow speed of the first fluid 194 may drop. In other words, when the fluid 193 outside the case passes through the inflow hole 104, part of the fluid 193 outside the case is blocked by the window unit 103, and as a result, the pressure of the first fluid 194 drops. This is referred to as the "pressure loss of the fluid". If the oscillators 101 and the inflow holes 104 are arranged to correspond to each other N-to-1, as illustrated in FIG. 4, each inflow hole 104 can be larger compared with the case of arranging the oscillators 101 and the inflow holes 104 to correspond to each other 1-to-1. Thereby the pressure loss of the first fluid 194 can be decreased, and the cooling efficiency of the oscillator 101 can be improved.

Figure 5:
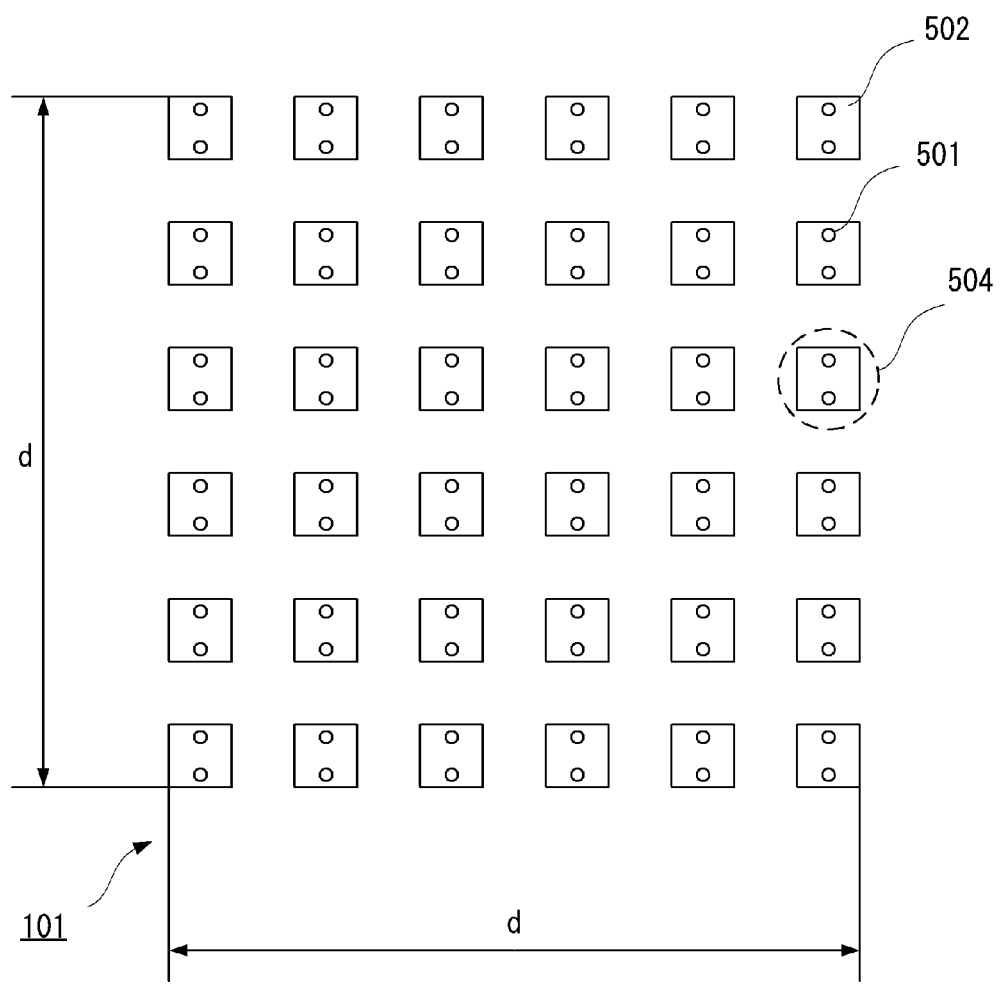
FIG. 5 is a diagram illustrating an arrangement example of oscillation elements of an oscillator according to Embodiment 1.

FIG. 5 is an arrangement example of the oscillation elements 504 of an oscillator 101. FIG. 5 is an example illustrating a general configuration of an oscillator 101, wherein 36 oscillation elements 504 are arrayed in order to increase the intensity of the terahertz waves on the front surface of the illumination apparatus 100. An oscillation element 504 is constituted of an element 501 having a gain in the frequency band of the terahertz wave and an antenna structure 502. Adjacent oscillation elements 504 are coupled by spatial coupling. Moreover, in accordance with the intervals between the adjacent oscillation elements 504, the phases of the terahertz waves generated from each oscillation element 504 synchronize in a specific state. By utilizing the synchronization of the phases of the terahertz waves, the intensity, directivity, emitting direction and the like of the terahertz waves from the front surface of the illumination apparatus 100 can be controlled. A number of oscillation elements 504 to be arrayed can be selected in accordance with the intensity and directivity required for the terahertz waves. The adjacent oscillation elements 504 may be coupled using wires. The element 501 used for the oscillation element 504 is not limited to RTD, but may be an element having a gain in the frequency band of the terahertz wave, such as a Gunn diode and an IMPATT diode. d is also referred to as an antenna opening.

In the case where 4 oscillation elements 504 are arranged in a matrix in one oscillator 101 and the phases of the terahertz waves generated from the oscillation elements 504 respectively are synchronized, the directivity of the terahertz wave is approximately 43° according to electromagnetic field analysis. Here the directivity of the terahertz wave is a half-value angle with respect to the power of the terahertz wave, and is an angle at which power is half the power of the terahertz wave in the maximum radiation direction. The directivity of the terahertz waves becomes sharper, from 23° to about 16°, as the number of oscillation elements 504 in one oscillator 101 increases from 16 to 36. By increasing a number of oscillation elements 504 to synchronize the phases of the terahertz waves 191 like this, the directivity of the terahertz waves 191 can be sharper.

In the case of arranging each oscillator 101 so as to overlap with each region where the inflow hole 104 is formed in the top view of the window unit 103, the ratio of the terahertz wave 191 propagating through the inflow hole 104 can be increased by making the directivity of the terahertz wave 191 sharper, as mentioned above. As a result, the loss of the terahertz wave 191 caused by the window unit 103 can be decreased. Furthermore, conductive metal can be used for the window unit 103 if the ratio of the terahertz wave 191 propagating through the inflow hole 104 is increased. By configuring the window unit 103 using metal, the noise generated in the illumination apparatus 100 is less likely to leak outside.

Generally the temperature rising $\Delta T$ [K] of a heating element is in inverse proportion to the thermal conductivity h [W/m$^2$K]. This means that the cooling efficiency of the heating element increases as the thermal conductivity h increases. In FIG. 1, if the flow speed of the first fluid 194 is U [m/s] and the first fluid 194 is a laminar flow, the thermal conductivity h is in proportion to the flow speed U to the 0.5th power. If the first fluid 194 is a turbulent flow, the thermal conductivity h is in proportion to the flow speed U to the 0.8th power. Hence, the first fluid 194 preferably is a turbulent flow, and if the first fluid 194 is a turbulent flow, the cooling efficiency of the oscillator 101 improves.

Whether turbulent flow is generated in the fluid or not can be determined by using a Reynolds number Re. Generally fluid transits from laminar flow to turbulent flow when the Reynolds number Re exceeds 2000. The Reynolds number Re is expressed by $\rho UD/\mu$, where $\rho$ [kg/m$^3$] is the density of the first fluid 194, $\mu$ [Kg/m·s] is a viscosity coefficient of the first fluid 194, and D [m] is a minimum width of the inflow hole 104. Therefore, the conditions of the minimum width D of the inflow hole 104, in the case where the first fluid 194 is a turbulent flow, is determined by the following Expression (1) using the flow speed U of the first fluid 194.

$$D > \frac{2000\mu}{U\rho} \quad (1)$$

When the ventilation amount of the discharging unit 105 is A [m$^3$/s], a cross-sectional area inside the case 102 is S [m$^2$], and the ratio (opening ratio) of the cross-sectional area S inside the case 102 with respect to the total area of the inflow holes 104 is a, the relationship between the ventilation amount A and the flow speed U of the first fluid 194 is calculated by the following Expression (2).

$$A = aSU \quad (2)$$

Based on Expression (1) and Expression (2), Expression (1) can be transformed into Expression (3) using the ventilation amount A of the discharging unit 105.

$$D > \frac{2000aS\mu}{A\rho} \quad (3)$$

The flow speed U of the first fluid 194 that flows from each inflow hole 104 (minimum width: D) into the case 102 decreases as the distance from the opening of the inflow hole 104 increases. Generally the distance from the inflow hole 104, at which the flow speed U of the first fluid 194 is virtually constant, is not more than 5D. Therefore, if each oscillator 101, which is a heat source, is disposed at a position of which distance from the inflow hole 104 is within 5D, the first fluid 194 can reach the oscillator 101 at the flow speed U. More specifically, in the case of the distance from each inflow hole 104 to the corresponding oscillator 101 is L, as illustrated in FIG. 1, it is preferable that L satisfies the relationship given by the following Expression (4).

$$L \leq 5D \quad (4)$$

By disposing each oscillator 101 at a position where this relationship is satisfied, the first fluid 194 can reach the oscillator 101 under the condition that the flow speed is the maximum, and a further improvement in the cooling efficiency of the oscillator 101 can be expected.

Next, the distance L, to further stabilize the oscillation operation of the oscillator 101, will be described. As illustrated in FIG. 5, each oscillation element 504 constituting the oscillator 101 includes an element 501 (gain element) and an antenna structure 502. The antenna structure 502 has a role of adjusting the phase conditions for the oscillation element 504 to oscillate at a desired frequency, and generating the terahertz wave. The antenna structure 502 also plays a role of an impedance matching device, to send the generated terahertz wave outside. Adjacent oscillation elements 504 are spatially coupled, and a phase of the terahertz wave generated from each oscillation element 504 is synchronized in a specific state. By using the synchronization of the phases of the terahertz wave, the intensity, directivity, emitting direction and the like of the terahertz wave from the front surface of the illumination apparatus 100 can be controlled.

For the oscillator 101, various antenna structures can be used, and if a member is disposed in a near field (Fresnel region) of the antenna, the characteristic of the antenna changes and the state of the terahertz wave also changes. Hence it is preferable that any member is not disposed in the near field of the antenna. In the case of the example illustrated in FIG. 5, the near field of the oscillator 101 is $2d^2/\lambda$, where d [m] is an antenna aperture of a plurality of antenna structures 502 in the oscillator 101, and $\lambda$ [m] is the wavelength of the terahertz wave. For example, the window unit 103, illustrated in FIG. 1, is preferably disposed outside the near field of the antenna of the oscillator 101. More specifically, in FIG. 1, it is preferable that the distance L, from each inflow hole 104 to the corresponding oscillator 101, satisfies the relationship given by the following Expression (5).

$$L \geq \frac{2d^2}{\lambda} \quad (5)$$

By disposing the window unit 103 and each inflow hole 104 at positions that satisfy this relationship, the oscillation operation of the oscillator 101 can be further stabilized by suppressing the influence of the antenna characteristic of the oscillator 101.

Based on Expression (4) and Expression (5), it is preferable that L satisfies the relationship given by the following Expression (6).

$$\frac{2d^2}{\lambda} \leq L \leq 5D \quad (6)$$

When the positional relationship between each oscillator 101 and the corresponding inflow hole 104 satisfies Expression (6), the operation of the oscillator 101 can be further stabilized, and the cooling efficiency of the oscillator 101 can also be improved.

Example 1

Example 1 will be described next as an aspect of Embodiment 1. More specifically, a design example of the minimum width D of each inflow hole 104 and the distance L from the inflow hole 104 to the oscillator 101 will be described. In the following description, a portion the same as the above description is denoted with the same reference sign, and detailed description thereof will be omitted.

Figure 6A:
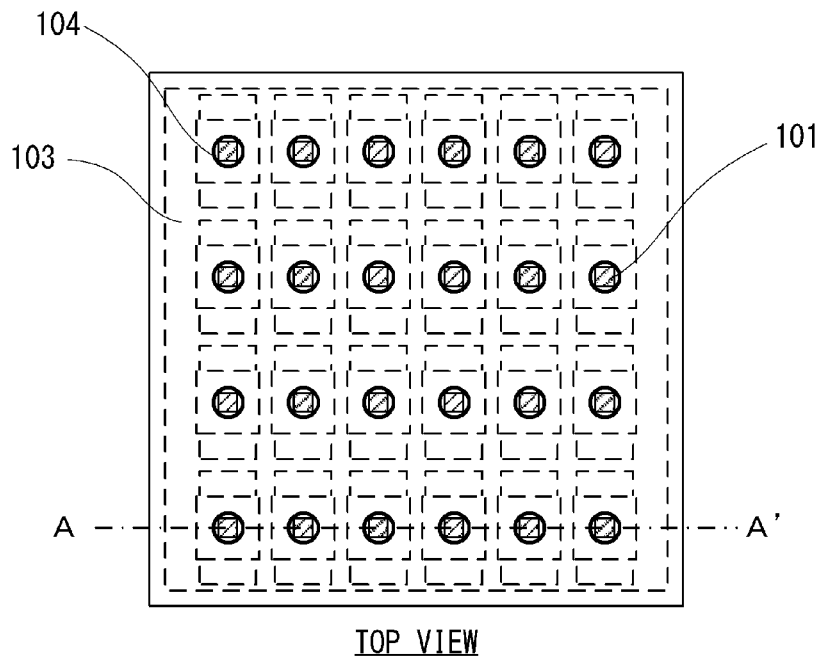
FIG. 6A and FIG. 6B are diagrams illustrating a configuration example of an illumination apparatus according to Example 1.
Figure 6B:
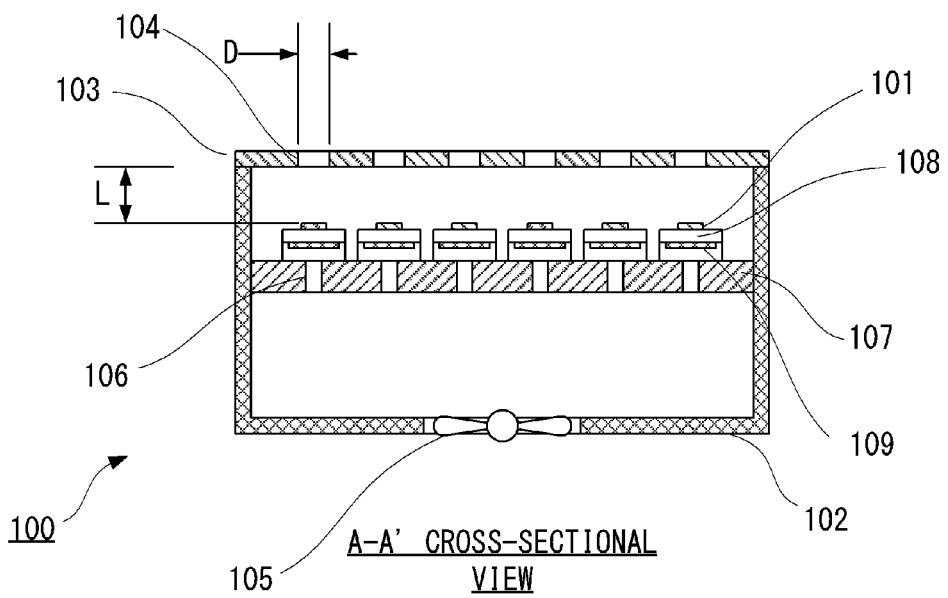

FIG. 6A and FIG. 6B indicate a configuration example of the illumination apparatus 100 according to Example 1. FIG. 6B is a cross-sectional view of the illumination apparatus 100 in FIG. 6A sectioned at the A-A' line. The fluid 193 outside the case, the first fluid 194, the fluid 195 inside the case and the second fluid 196 are comprised of air. The density $\rho$ of the first fluid 194 is 1.206 kg/m³, and the viscosity coefficient $\mu$ of the first fluid 194 is $1.83\times10^{-5}$ kg/m·s.

The case 102 is formed of aluminum, and the inside dimensions of the case 102 (dimensions in a direction parallel with the surface of the substrate 107, where oscillators 101 are disposed) is 100 mm×100 mm. The sectional area S inside the case 102 is 0.01 m². In order to improve the efficiency of the heat radiation, it is preferable that the aluminum is plated in black by an alumite treatment or the like. The discharging unit 105 is a DC fan, and is disposed at the 30 mm×30 mm sized opening formed in the case 102. In this case, the ventilation amount of the DC fan is assumed to be 0.36 m³/min. However, considering the pressure loss of the fluid caused by the structures of the inflow holes 104 and the outflow holes 106, the ventilation amount of the DC fan of Example 1 is assumed to be half the above ventilation amount, that is, the ventilation amount A is assumed to be 0.18 m³/min (0.003 m³/s).

The oscillator 101 is extracted from a semiconductor wafer to a 3 mm×3 mm size, and one oscillator 101 is mounted on one package 108. The configuration of the oscillator 101 is the same as the configuration in FIG. 5. In the oscillator 101, the 36 oscillation elements 504 that oscillate terahertz waves are arranged in a matrix, as illustrated in FIG. 5. The antenna structure 502 is a 150 μm×150 μm patch antenna structure. The antenna opening d is 1.65 mm. The wavelength $\lambda$ of the terahertz wave oscillated by the oscillation element 504 is 600 μm (frequency: 0.5 THz). 24 packages 108 are arranged on the substrate 107, and the illumination apparatus 100 is constituted by 24 oscillators 101.

The window unit 103 is formed of 3 mm thick high density polyethylene. Each inflow hole 104 formed in the window unit 103 has a circular opening, and as illustrated in FIG. 6A and FIG. 6B, the inflow holes 104 and the oscillators 101 are arranged so as to correspond to each other one-to-one. More specifically, there are 24 inflow holes 104, which are disposed such that the center of each oscillator 101 and the center of each inflow hole 104 approximately match in the top view of the window unit 103.

When the minimum width of each inflow hole 104 is D and a number of inflow holes 104 is N, the opening ratio a is calculated by the following Expression (7).

$$a = \frac{N\pi\left(\frac{D}{2}\right)^2}{S} \quad (7)$$

Then by using Expression (3) and Expression (7), the hole diameter D of the inflow hole 104, to generate turbulent flow in the first fluid 194, can be determined using Expression (8).

$$D < \frac{\rho A}{500 N \pi \mu} \quad (8)$$

As illustrated in FIG. 6A, a number of inflow holes 104 is 24 (N=24) in Example 1. Further, the first fluid 194 is comprised of air (density ρ is 1.206 kg/m³, viscosity coefficient μ is 1.83×10⁻⁵ kg/m·s). The ventilation amount A of the discharging unit 105 is 0.003 m³/s. In this case, if the minimum width D, which is a hole diameter of the inflow hole 104, is smaller than 5.24 mm, turbulent flow is generated in the first fluid 194. Therefore, in Example 1, the minimum width D of the inflow hole 104 is set to 5 mm.

Based on Expression (6), when the antenna opening d of the oscillator 101 is 1.65 mm and the wavelength λ of the terahertz wave is 600 μm (frequency: 0.5 THz), the distance L from the inflow hole 104 to the oscillator 101 is 9 mm<L<25 mm Hence in Example 1, the distance L from the inflow hole 104 to the oscillator 101 is set to 10 mm.

By this configuration of the illumination apparatus 100, an illumination apparatus that can operate more stably, by reducing the dispersion of the cooling efficiency of oscillators which emit terahertz waves, can be provided.

Embodiment 2

An illumination apparatus according to Embodiment 2 will be described next. More specifically, in Embodiment 2, a window unit 703, instead of the window unit 103, is used in the illumination apparatus according to Embodiment 1. In the following description, a portion the same as the above description is denoted with the same reference sign, and detailed description thereof will be omitted.

Figure 7A:
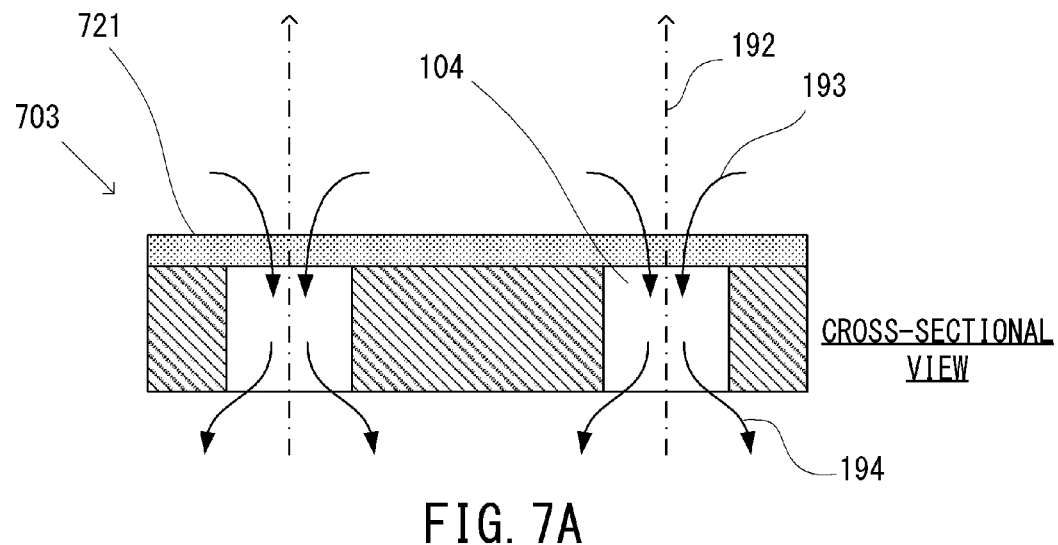
FIG. 7A and FIG. 7B are diagrams illustrating a configuration example of a window unit of an illumination apparatus according to Embodiment 2.
Figure 7B:
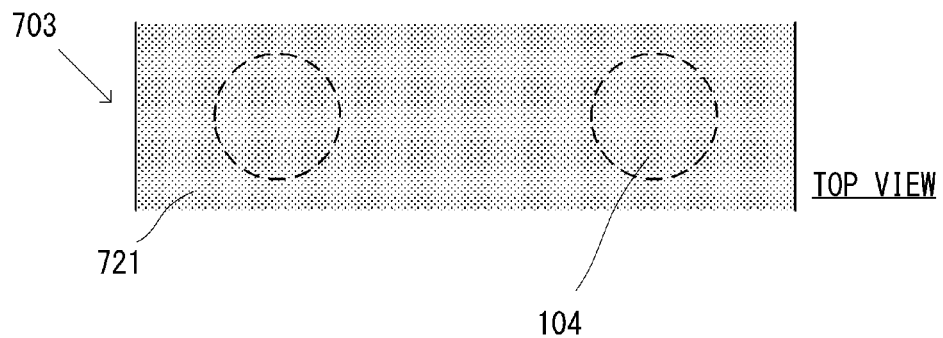

FIG. 7A and FIG. 7B are a cross-sectional view and a top view of a window unit 703 respectively according to Embodiment 2. As illustrated in FIG. 7A and FIG. 7B, the window unit 703 includes a dustproof unit 721, which prevents dust outside the apparatus from entering the case 102. The dustproof unit 721 is formed of a material that the terahertz wave can transmit through, and has a continuous porous structure. For the dustproof unit 721, a resin sheet having continuous porosity or foamability, such as polyethylene, polystyrene or Teflon (registered trademark), is used. Further, as illustrated in FIG. 7A and FIG. 7B, the dustproof unit 721 is disposed on the window unit 703 so as to cover the openings of the inflow holes 104. More specifically, the dustproof unit 721 is disposed to contact the top edge of the inflow holes 104, so as to cross with the travelling axis 192 of the terahertz wave generated by each oscillator 101.

The dustproof unit 721, which is disposed at the inflow holes 104 of the window unit 703, prevents dust outside the apparatus from entering the case 102 via the inflow holes 104 when the fluid 193 outside the case flows into the case 102. As a result, the collision of dust particles with the oscillators 101, which are not illustrated in FIG. 7A and FIG. 7B, can be prevented. Since cases of dust particles colliding with the oscillators 101 causing failure of the oscillators 101 are prevented, the flow speed of the first fluid 194 can be increased. As a result, according to Embodiment 2, the cooling efficiency of the oscillators 101 can be further improved.

Moreover, when the fluid 193 outside the case passes through the dustproof unit 721, the flow of the fluid 193 outside the case is irregularly disturbed by the porous structure of the dustproof unit 721, and then the fluid 193 flows into the inflow holes 104 through the pores of the dustproof unit 721. Therefore, by disposing the dustproof unit 721, a configuration, that is virtually the same as the configuration where a plurality of inflow holes are additionally formed inside each inflow hole 104, can be implemented. As a result, the first fluid 194 more easily becomes a turbulent flow, and a further improvement of the cooling efficiency of the oscillators 101 can be expected.

Figure 8A:
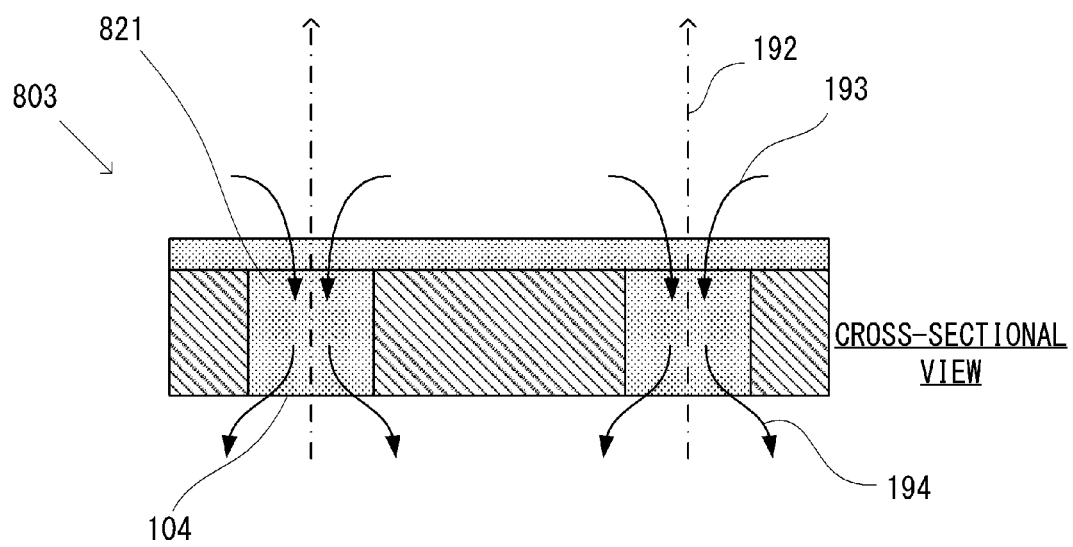
FIG. 8A and FIG. 8B are diagrams illustrating another aspect of a window unit of an illumination apparatus according to Embodiment 2.
Figure 8B:
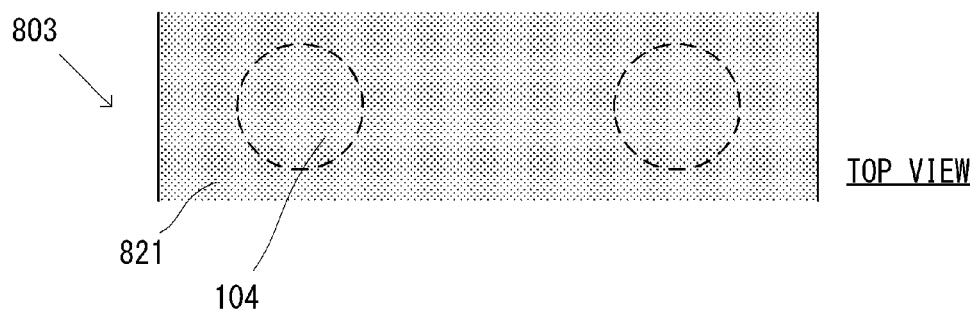

FIG. 8A and FIG. 8B are a cross-sectional view and a top view of a window unit 803, which is a modification of the window unit 703 respectively. As illustrated in FIG. 8A and FIG. 8B, the window unit 803 includes a dustproof unit 821. A part of this dustproof unit 821 is inserted into each inflow hole 104. This structure is implemented by processing a polyethylene plate, a polystyrene plate or a Teflon (registered trademark) plate into convex portions in accordance with the shapes of the inflow holes 104, and press-fitting the processed convex portions into the inflow holes 104.

In the case of using the dustproof unit 821 which is inserted into the inflow holes 104, the regions for the fluid 193 to flow through can be increased compared with the dustproof unit 721, hence the strength of the dustproof unit 821 can also be increased compared with the dustproof unit 721. As a result, the flow speed of the first fluid 194 can be increased, whereby the cooling efficiency of the oscillators 101 can be further improved.

Embodiment 3

An illumination apparatus according to Embodiment 3 will be described next. More specifically, the illumination apparatus according to Embodiment 3 includes a window unit 903, instead of the window unit 103 of the illumination apparatus according to Embodiment 1. In the window unit 903, inflow holes 904 are disposed instead of the inflow holes 104 of the window unit 103. In the following description, a portion the same as the above description is denoted with the same reference sign, and detailed description thereof will be omitted.

Figure 9A:
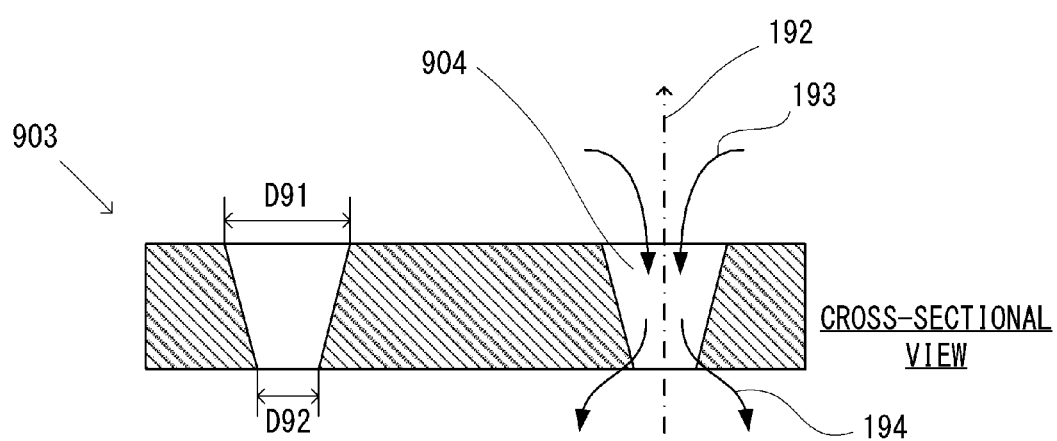
FIG. 9A and FIG. 9B are diagrams illustrating a shape of an inflow hole of an illustration apparatus according to Embodiment 3.
Figure 9B:
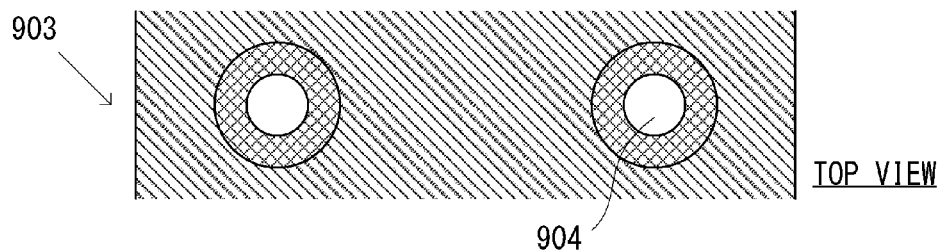

FIG. 9A and FIG. 9B are a cross-sectional view and a top view of the window unit 903 respectively, for describing the configuration of the inflow hole 904 of Embodiment 3. As illustrated in FIG. 9A, each inflow hole 904 has a tapered shape where the opening size (diameter) decreases in the direction toward the oscillator 101 (not illustrated), that is, the downward direction in FIG. 9A. In other words, the opening size (diameter) D91 of the inflow hole 904, on the side where the fluid 193 outside the case flows into the inflow hole 904, is wider than the opening size (diameter) D92 of the inflow hole 904 on the side where the fluid 193 flows out of the inflow hole 904 as the first fluid 194.

Since the side wall of the inflow hole 904 is diagonal to form the abovementioned tapered shape, the opening size, on the side where the fluid 193 outside the case flows in, is wider than the other side. Therefore, the change of the structure of the inflow hole 904 in the steps, from the fluid 193 outside the case flowing into the inflow hole 904 to the fluid 193 flowing out of the inflow hole 904 as the first fluid 194, becomes more gentle. As a result, the pressure loss of the fluid 193 is decreased and the drop in the flow speed of the first fluid 194 that flows from the inflow hole 904 is also suppressed, and a further improvement of the cooling efficiency of the oscillators 101 (not illustrated) can be expected.

Figure 10A:
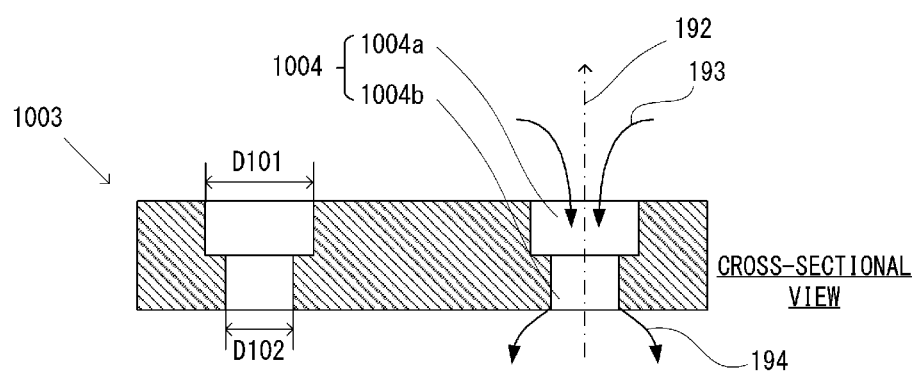
FIG. 10A and FIG. 10B are diagrams illustrating another aspect of an inflow hole of an illumination apparatus according to Embodiment 3.
Figure 10B:
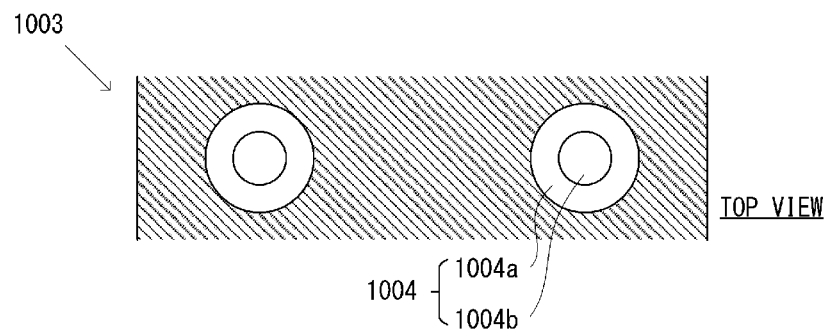

FIG. 10A and FIG. 10B are a cross-sectional view and a top view of a window unit 1003, which is another aspect of the window unit 903 respectively. In the window unit 1003, inflow holes 1004 are formed. As illustrated in FIG. 10A and FIG. 10B, each inflow hole 1004 is constituted of two opening portions, 1004a and 1004b, of which opening sizes (diameters) are different from each other. More specifically, the opening size (diameter) D101 of the opening portion 1004a, through which the fluid 193 outside the case flows into, is wider than the opening size (diameter) D102 of the opening portion 1004b through which the fluid 193 flows out as the first fluid 194.

Figure 11A:
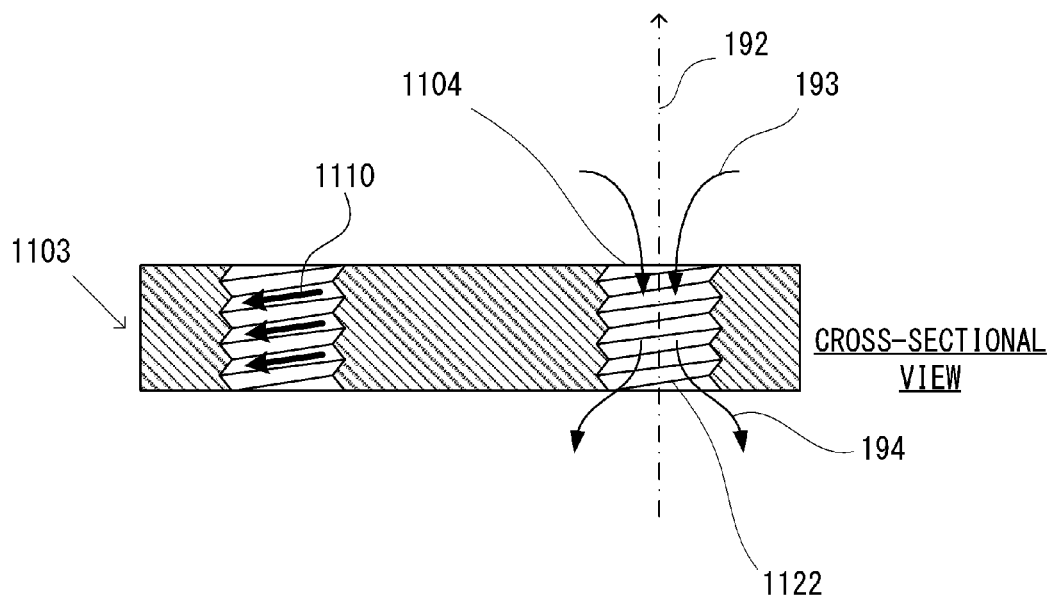
FIG. 11A and FIG. 11B are diagrams illustrating still another aspect of an inflow hole of an illumination apparatus according to Embodiment 3.
Figure 11B:
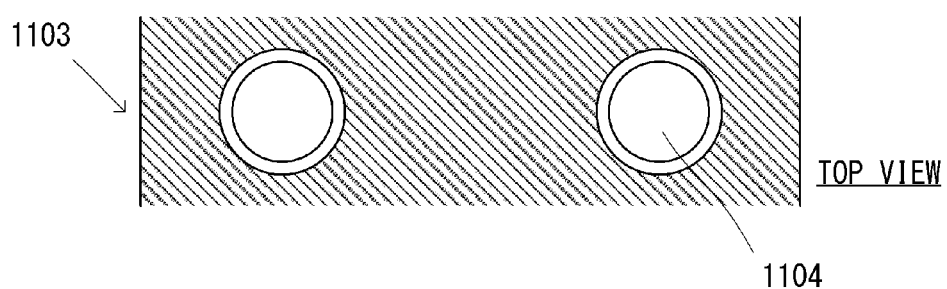

FIG. 11A and FIG. 11B are a cross-sectional view and a top view of a window unit 1103, which is another aspect of the window unit 903 or 1003 respectively. As illustrated in FIG. 11A, each inflow hole 1104 has a spiral structure, where a groove is formed in a spiral on the side wall in the direction into the case (downward direction in FIG. 11A). Because of this spiral structure, a rotating force is applied to the fluid 193 outside the case, as indicated by the arrow mark 1110, when the fluid 193 outside the case passes through the inflow hole 1104, thereby the flow speed of the fluid 193 increases. As a result, a turbulent flow is more easily generated in the first fluid 194 which flows out of the inflow hole 1104. Therefore, as described above, an improvement in the cooling efficiency of the oscillators 101, due to the generation of the turbulent flow in the first fluid 194, can be expected.

According to the technique of the present invention, the dispersion of the cooling efficiency of the oscillators can be reduced, and operation of the illumination apparatus can be more stable.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-190193, filed on Oct. 17, 2019, which is hereby incorporated by reference herein in its entirety.

What is claimed is:
1. An illumination apparatus, comprising:
a case;
a plurality of oscillators configured to generate electromagnetic waves, and housed in the case and arranged two-dimensionally;
a window unit configured to emit therefrom the electromagnetic waves, and disposed on a first side of the case;
a plurality of inflow holes configured to allow fluid to flow into the case, and disposed at positions at which the electromagnetic waves from the window unit propagate; and
a discharging unit configured to discharge the fluid, which has flowed into the case, out of the case, and disposed on a second side of the case, which is an opposite side to the first side, wherein
when the oscillator is viewed from the window unit, at least a part of the oscillator is located on an inner side of the inflow hole, and
the fluid which has flowed into the case through the inflow hole reaches the oscillator.

2. The illumination apparatus according to claim 1, wherein the window unit is constituted of a material through which the electromagnetic waves transmit.

3. The illumination apparatus according to claim 1, further comprising:
a package on which each of the oscillators is mounted;
a substrate on which the package is fixed; and
a plurality of inflow holes configured to allow the fluid, which has flowed into the case, out to the discharging unit, and disposed in the substrate, wherein
the oscillator and the outflow hole are disposed to face each other.

4. The illumination apparatus according to claim 1, further comprising a dustproof unit formed of a material through which the electronic waves transmit, and having a continuous porous structure, wherein
the dustproof unit is disposed so as to cover the plurality of inflow holes.

5. The illumination apparatus according to claim 4, wherein a part of the dustproof unit is inserted into the plurality of inflow holes.

6. The illumination apparatus according to claim 1, wherein at least one of the plurality of inflow holes is constituted of a plurality of opening portions of which opening diameters differ from each other.

7. The illumination apparatus according to claim 1, wherein at least one of the plurality of inflow holes has a tapered-shape in which the opening diameter thereof decreases in a direction toward the case.

8. The illumination apparatus according to claim 1, wherein at least one side wall of each of the plurality of inflow holes is formed with a spiral groove.

9. The illumination apparatus according to claim 1, wherein when a minimum width of the inflow hole is D (m), a flow speed of the fluid that flows out of the inflow hole is U (m/s), a density of the fluid is ρ (kg/m³), and a viscosity coefficient of the fluid is μ (kg/m·s), Expression (1) below is established:

$$D > \frac{2000\mu}{U\rho}. \tag{1}$$

10. The illumination apparatus according to claim 1, wherein when a distance from the inflow hole to the oscillator is L (m) and a minimum width of the inflow hole is D (m), Expression (2) below is established:

$$L \leq 5D \tag{2}$$

11. The illumination apparatus according to claim 1, wherein
   the oscillator includes a plurality of oscillation elements configured to oscillate the electromagnetic wave, the oscillation elements each including an element having a gain in the frequency band of the electromagnetic wave, and an antenna,
   adjacent oscillation elements out of the plurality of oscillation elements are coupled, and phases of the respective electromagnetic waves oscillated by the adjacent oscillation elements synchronize.

12. The illumination apparatus according to claim 11, wherein when a distance from the inflow hole to the oscillator is L (m), an antenna opening of the antenna is d (m), and a wavelength of the electromagnetic wave is λ (m), Expression (3) below is established:

$$L \geq \frac{2d^2}{\lambda}. \tag{3}$$

13. The illumination apparatus according to claim 1, wherein the frequency of the electromagnetic wave is at least 0.2 THz and not more than 30 THz.

14. A camera system, acquiring a two-dimensional distribution of electromagnetic waves from a subject, the camera system comprising:
   the illumination apparatus according to claim 1 configured to irradiate the subject with the electromagnetic waves;
   an image forming unit configured to form an image of the electromagnetic waves reflected by the subject; and
   a sensor unit configured to detect a two-dimensional distribution of the electromagnetic waves formed by the image forming unit.

* * * * *